United States Patent [19]
Kim et al.

[11] Patent Number: 6,144,247
[45] Date of Patent: Nov. 7, 2000

[54] ANTI-FUSE PROGRAMMING CIRCUIT USING VARIABLE VOLTAGE GENERATOR

[75] Inventors: Young-Hee Kim, Pahang-shi; Kie-Bong Ku, Yicheon-shi, both of Rep. of Korea

[73] Assignee: Hyundai Electronics Industries Co., Ltd., Yicheon-shi, Rep. of Korea

[21] Appl. No.: 09/342,510

[22] Filed: Jun. 29, 1999

[30] Foreign Application Priority Data

Jun. 30, 1998 [KR] Rep. of Korea ............. 98-26223

[51] Int. Cl.$^7$ ................................. H01H 37/76
[52] U.S. Cl. .................................. 327/525; 327/526
[58] Field of Search .................. 327/525, 526; 365/96, 200, 225.7

[56] References Cited

U.S. PATENT DOCUMENTS

| | | | |
|---|---|---|---|
| 5,491,444 | 2/1996 | McClure | 324/525 |
| 5,517,455 | 5/1996 | McClure et al. | 327/525 |
| 5,583,463 | 12/1996 | Merrit | 327/526 |
| 5,689,455 | 11/1997 | Mullarkey et al. | |
| 5,726,585 | 3/1998 | Kim | 327/525 |
| 5,818,285 | 10/1998 | Lee et al. | 327/525 |

*Primary Examiner*—Terry D. Cunningham
*Attorney, Agent, or Firm*—Oliff & Berridge, PLC

[57] ABSTRACT

An anti-fuse programming circuit comprising a variable voltage generator for varying the level of its output voltage in response to a programming signal, a buffer for making gentle variations in the output voltage from the variable voltage generator, an operation switching part for precharging the anti-fuse programming circuit with the output voltage from the variable voltage generator to operate it, an anti-fuse connected to the operation switching part, the anti-fuse being subjected to a dielectric breakdown when it is supplied with an overcurrent, a sense signal input part for inputting a sense signal to verify a programmed state of the anti-fuse, a breakdown voltage supply part for supplying the output voltage from the variable voltage generator for the dielectric breakdown of the anti-fuse, an output part for outputting a signal indicative of the programmed state of the anti-fuse in response to the sense signal inputted by the input part, a current blocking part for blocking a current path from the breakdown voltage supply part to the anti-fuse in response to a control signal from the output part, and a latch part for strongly stabilizing the anti-fuse at the level of the output voltage from the variable voltage generator in response to the control signal from the output part. Current consumption can significantly be reduced in programming the anti-fuse.

10 Claims, 3 Drawing Sheets

ANTI-FUSE PROGRAMMING CIRCUIT USING VARIABLE VOLTAGE GENERATOR

BACKGROUND OF THE INVENTION

1. Field of the Invention

The present invention relates in general to anti-fuse programming circuits, and more particularly to an anti-fuse programming circuit which is capable of programming an anti-fuse by varying a voltage level of an internal voltage generator, to increase a programming efficiency, and of preventing a leakage current from flowing upon the programming of the anti-fuse, using a feedback loop, to reduce its power consumption.

2. Description of the Prior Art

A general fuse, when the amount of current exceeding a predetermined value flows therethrough, melts and blows due to a generated heat to form an open circuit for the protection of the associated device.

On the other hand, a fuse is used in a redundancy circuit for a semiconductor memory device to replace a failed line with a spare line. In order to program the fuse used, there have been proposed various methods such as, for example, an electrical fuse method of applying an overcurrent to the fuse to melt and cut it and a laser cutting method of applying a laser beam to the fuse to burn and cut it.

Among the above methods, the laser cutting method is widely used because it is simple, reliable and easy to lay out. In this case, the fuse is made of a polysilicon wire or metal wire.

The overcurrent cutting method requires a high current driver and fuse blowing pad, resulting in an increase in occupying area. Further, a residue may be present after the cutting, thus causing a switch-off phenomenon.

In the case of cutting polysilicon using a laser beam, an error may occur in accurately applying the laser beam to the polysilicon and a residue may be present after the cutting. In this case, the laser cutting method requires a large amount of processing time, and it is inaccurate and difficult to perform. Further, the repair is impossible at a package level, resulting in a degradation in reliability.

In order to solve the above problems, there has recently been proposed a new element, or a so-called anti-fuse, which can be programmed simply even at the package level.

The anti-fuse is programmed to interconnect an upper electrode and lower electrode. Namely, the anti-fuse includes an insulating film formed between the upper and lower electrodes in such a manner that it can easily be broken down according to a dielectric breakdown voltage which is a voltage difference between the upper and lower electrodes.

In this regard, the anti-fuse is programmed to interconnect two electrodes, whereas a general fuse is programmed to disconnect them from each other.

As a result, there is a need for a circuit which is capable of programming the anti-fuse and verifying the programmed result of the anti-fuse.

SUMMARY OF THE INVENTION

Therefore, the present invention has been made in view of the above problems, and it is an object of the present invention to provide an anti-fuse programming circuit which is capable of programming an anti-fuse by varying a voltage level of an internal voltage generator and of blocking a current path to reduce its current consumption.

In accordance with the present invention, the above and other objects can be accomplished by a provision of an anti-fuse programming circuit comprising variable voltage generation means for varying the level of its output voltage in response to a programming signal; buffering means for making gentle variations in the output voltage from the variable voltage generation means; operation switching means for precharging the anti-fuse programming circuit with the output voltage from the variable voltage generation means to operate it; an anti-fuse connected to the operation switching means, the anti-fuse being subjected to a dielectric breakdown when it is supplied with an overcurrent; sense signal input means for inputting a sense signal to verify a programmed state of the anti-fuse; breakdown voltage supply means for supplying the output voltage from the variable voltage generation means for the dielectric breakdown of the anti-fuse; output means for outputting a signal indicative of the programmed state of the anti-fuse in response to the sense signal inputted by the sense signal input means; current blocking means for blocking a current path from the breakdown voltage supply means to the anti-fuse in response to a control signal from the output means; and latch means for strongly stabilizing the anti-fuse at the level of the output voltage from the variable voltage generation means in response to the control signal from the output means.

The anti-fuse remains insulated at the level of a half voltage and it is subjected to the dielectric breakdown at the level of a source voltage.

The variable voltage generation means outputs the half voltage at a normal state and the source voltage at a programming state. At the normal state, the operation switching means precharges the anti-fuse programming circuit with the half voltage from the variable voltage generation means. The latch means strongly stabilizes the anti-fuse at the level of the output voltage from the variable voltage generation means.

If the programming signal is inputted to program the anti-fuse under the above precharged condition, the output voltage from the variable voltage generation means rises to the source voltage level. Namely, the output voltage from the variable voltage generation means varies from the half voltage level to the source voltage level. The breakdown voltage supply means supplies the source voltage from the variable voltage generation means to the anti-fuse for the dielectric breakdown thereof, resulting in the anti-fuse being programmed.

If the sense signal is inputted by the sense signal input means to verify the programmed state of the anti-fuse under the condition that the anti-fuse is programmed in the above manner, the output means outputs the signal indicative of the programmed state of the anti-fuse.

The dielectric breakdown of the anti-fuse may result in the forming of a current path from the breakdown voltage supply means to the anti-fuse. At this time, the current blocking means functions to block such a current path in response to the control signal from the output means to prevent further current consumption.

The buffering means is connected to an output terminal of the variable voltage generation means to prevent an abrupt variation in the precharge voltage. This makes it possible to program the anti-fuse even at a low voltage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
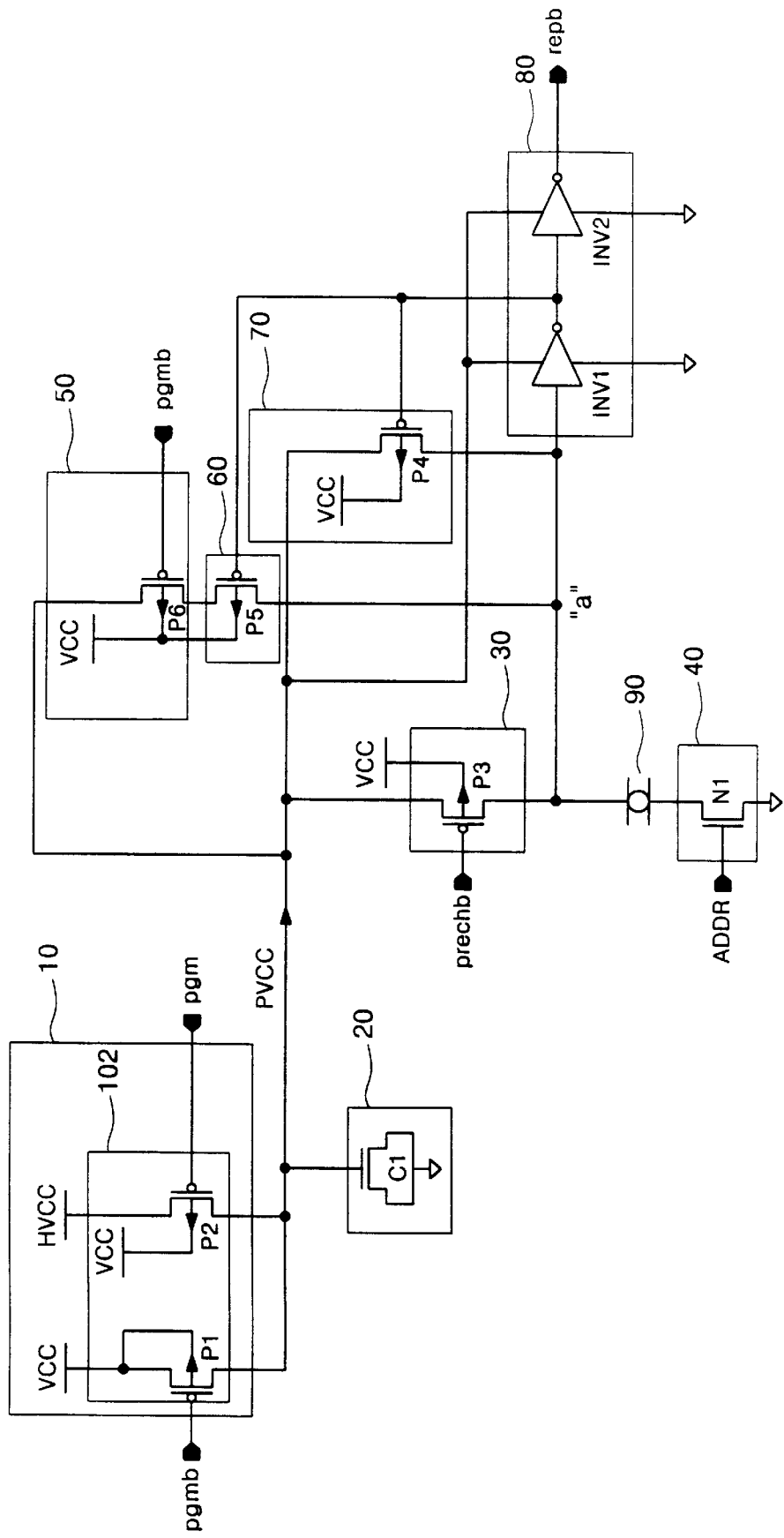
FIG. 1 is a circuit diagram showing the construction of an anti-fuse programming circuit in accordance with an embodiment of the present invention.

FIG. 1 is a circuit diagram showing the construction of an anti-fuse programming circuit which is applied to a memory device in accordance with an embodiment of the present invention.

With reference to FIG. 1, a variable voltage generator 10 includes a switching part 102 for switching an output signal from the variable voltage generator 10 to any one of a source voltage VCC and half voltage HVCC in response to a programming signal pgm and complementary programming signal pgmb.

The switching part 102 is adapted to output the source voltage VCC at a programming state and the half voltage HVCC at a normal state. To this end, the switching part 102 is provided with a first PMOS transistor P1 connected between the source voltage VCC and an output terminal PVCC of the variable voltage generator 10 and switched in response to the complementary programming signal pgmb, and a second PMOS transistor P2 connected between the half voltage HVCC and the output terminal PVCC and switched in response to the programming signal pgmb.

A buffer 20 is connected to the output terminal PVCC of the variable voltage generator 10. The buffer 20 includes a large-capacity NMOS capacitor C1 as a reserve capacitor, connected to a ground voltage terminal. The reserve capacitor functions to allow the output signal from the variable voltage generator 10 to vary slowly according to a delay time corresponding to a time constant based on a capacity of the reserve capacitor when it varies from 0V to the half voltage HVCC or from the half voltage HVCC to the source voltage VCC.

The above operation of the buffer 20 is insignificant at the normal state, but is important for the checking on a state of an anti-fuse 90 upon application of an abrupt signal.

The reason is that the anti-fuse 90 acts as a capacitor prior to being subjected to a dielectric breakdown and current thus flows therethrough when the source voltage VCC suffers an abrupt variation. As a result, there is a disadvantage in that a high voltage is required in programming the anti-fuse.

An operation switching part 30 is adapted to precharge the anti-fuse programming circuit with an output voltage from the variable voltage generator 10 to operate it. To this end, the operation switching part 30 is provided with a third PMOS transistor P3.

The third PMOS transistor P3 has its drain connected to the output terminal PVCC of the variable voltage generator 10, its source connected to one side of the anti-fuse 90 and its gate for inputting a complementary precharge signal prechb.

A common connection point of the one side of the anti-fuse 90 and the source of the third PMOS transistor P3 will be referred to hereinafter as a node 'a'.

A sense signal input part 40 includes an NMOS transistor N1 having its drain connected to the other side of the anti-fuse 90, its source connected to the ground voltage terminal and its gate for inputting a failed address signal ADDR.

A breakdown voltage supply part 50 is adapted to supply the output voltage from the variable voltage generator 10 to the node a. To this end, the breakdown voltage supply part 50 is provided with a sixth PMOS transistor P6.

A current blocking part 60 is adapted to interrupt a breakdown voltage supplied from the breakdown voltage supply part 50 to block a current path from the breakdown voltage supply part 50 to the anti-fuse 90 after the anti-fuse 90 is programmed. To this end, the current blocking part 60 is provided with a fifth PMOS transistor PS.

The sixth PMOS transistor P6 has its source connected to the output terminal PVCC of the variable voltage generator 10, its drain connected to a source of the fifth PMOS transistor PS and its gate for inputting the complementary programming signal pgmb. The fifth PMOS transistor P5 has its drain connected to the node a and its gate for inputting an output signal from a first inverter INV1 in an output part 80 fed back thereto, which inverts a voltage level at the node a.

The first inverter INV1 is enabled by the output voltage from the variable voltage generator 10. In other words, the first inverter INV1 is enabled by the source voltage VCC at the programming state and by the half voltage HVCC at the normal state.

A latch part 70 is adapted to supply the output voltage from the variable voltage generator 10 to the node a to strongly stabilize the voltage level at the node a. To this end, the latch part 70 is provided with a fourth PMOS transistor P4 having its drain connected to the output terminal PVCC of the variable voltage generator 10, its source connected to the node a and its gate connected to an output terminal of the first inverter INV1.

The first inverter INV1 is connected to the one side of the anti-fuse 90, or the node a, and enabled by the output voltage PVCC from the variable voltage generator 10 to invert the voltage level at the node a. The output part 80 further includes a second inverter INV2 enabled by the output voltage PVCC from the variable voltage generator 10 to invert an output signal from the first inverter INV1. With this construction, the output part 80 is adapted to output a voltage state at the node a.

An output signal from the output part 80 becomes high in level at the normal state and low in level in response to the address signal ADDR being applied to the sense signal input part 40 when the anti-fuse 90 is programmed.

Figure 2:
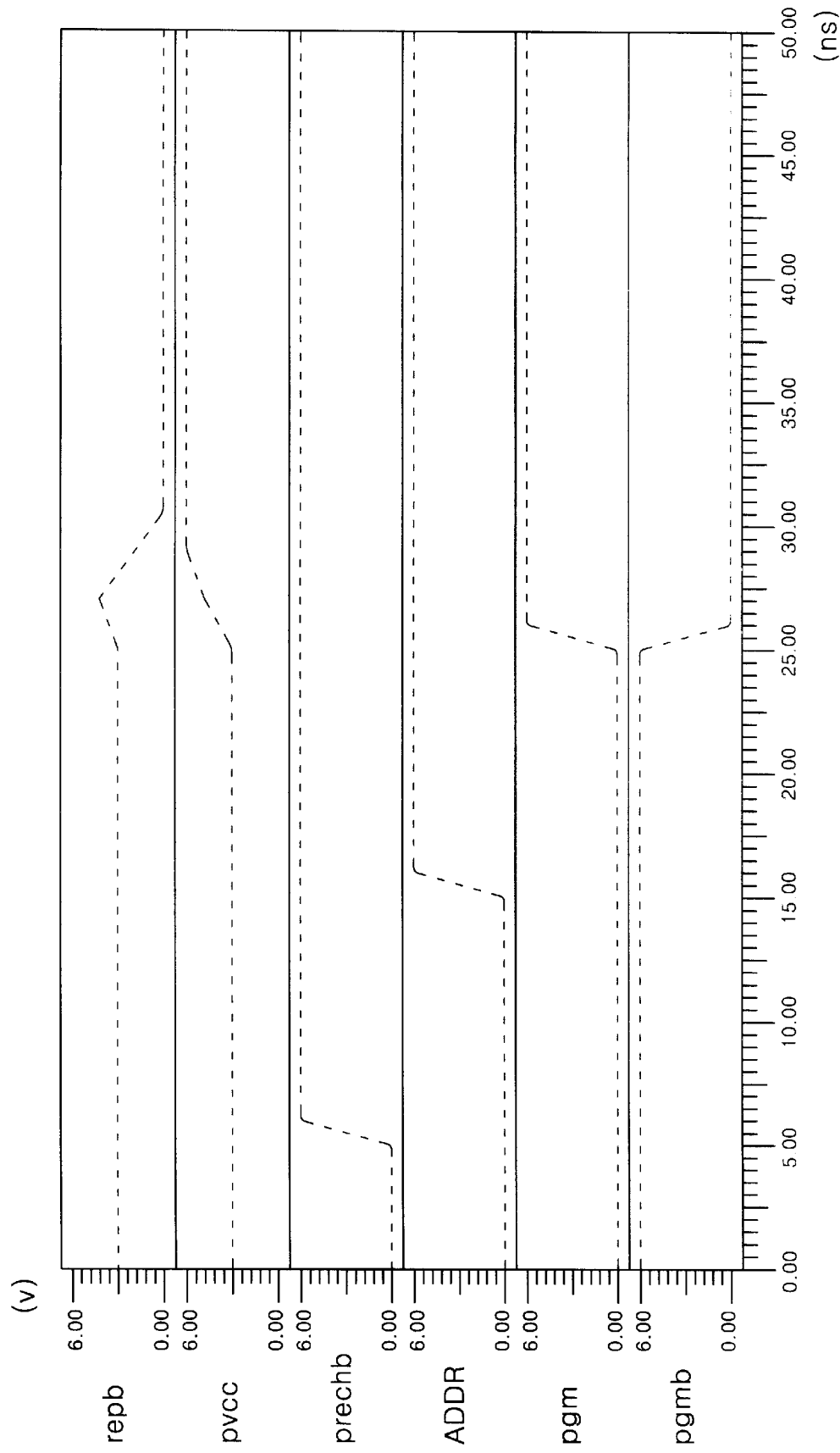
FIG. 2 is a graph showing the simulated results of input/output signals in the anti-fuse programming circuit of FIG. 1.

FIG. 2 is a graph showing the simulated results of the input/output signals in the anti-fuse programming circuit in FIG. 1.

The operation of the anti-fuse programming circuit with the above-mentioned construction in accordance with the present invention will hereinafter be described in detail with reference to FIG. 2.

First, at the normal state, the programming signal pgm becomes low in level and the complementary programming signal pgmb becomes high in level.

At this time, in the variable voltage generator 10, the first PMOS transistor P1 is turned off and the second PMOS transistor P2 is turned on, thereby causing the half voltage HVCC to be transferred to the output terminal PVCC.

Namely, the variable voltage generator 10 functions to output the half voltage HVCC at the normal state and the source voltage VCC at the programming state. This allows a high voltage not to be applied to the anti-fuse programming circuit at the normal state, so as to reduce current consumption at the normal state.

At this time, if the complementary precharge signal prechb goes low in level to precharge the anti-fuse programming circuit, the third PMOS transistor P3 in the operation switching part 30 is turned on to supply the output voltage from the variable voltage generator 10 to the node a.

Also, the output of the output part 80, or the output of the second inverter INV2, becomes high in level. This high level output of the output part 80 has the level of the half voltage HVCC because the second inverter INV2 is enabled by the half voltage HVCC.

If the complementary precharge signal prechb goes high in level under the above precharged condition, the third PMOS transistor P3 is turned off and the half voltage HVCC is thus not applied to the node a. At this time, the node a, however, remains precharged strongly with the half voltage HVCC by the latch part 70.

The fifth PMOS transistor P5 in the current blocking part 60 remains on in response to the low level output of the first inverter INV1 fed back thereto.

At this time, if the failed address signal ADDR goes high in level to sense the programmed state of the anti-fuse 90, the NMOS transistor N1 is turned on. However, because there is no dielectric breakdown in the anti-fuse 90, the node a is not changed in voltage level, resulting in no variation in the output repb of the output part 80.

Thereafter, when the programming signal pgm goes high in level to program the anti-fuse 90, the complementary programming signal pgmb becomes low in level. As a result, in the variable voltage generator 10, the first PMOS transistor P1 is turned on and the second PMOS transistor P2 is turned off, thereby causing the output voltage PVCC to rise to the level of the source voltage VCC on the basis of the time constant of the buffer 20.

The sixth PMOS transistor P6 is also turned on in response to the complementary programming signal pgmb to supply the source voltage VCC from the output terminal PVCC of the variable voltage generator 10 to the node a. As a result, a current path is formed from the node a to the ground voltage terminal through the anti-fuse 90 and the turned-on NMOS transistor N1, thus causing a dielectric breakdown in the anti-fuse 90.

If the dielectric breakdown occurs in the anti-fuse 90 in the above manner, the node a is changed from high to low in level and then inverted from low to high in level by the first inverter INV1. As a result, the fifth PMOS transistor P5 in the current blocking part 60 and the fourth PMOS transistor P4 in the latch part 70 are turned off so that the source voltage VCC cannot further be supplied to the node a.

Then, the low level voltage at the node a is sequentially inverted by the first and second inverters INV1 and INV2, resulting in the output repb of the output part 80 becoming low in level. This indicates that the programmed state of the anti-fuse 90 is normal.

Figure 3:
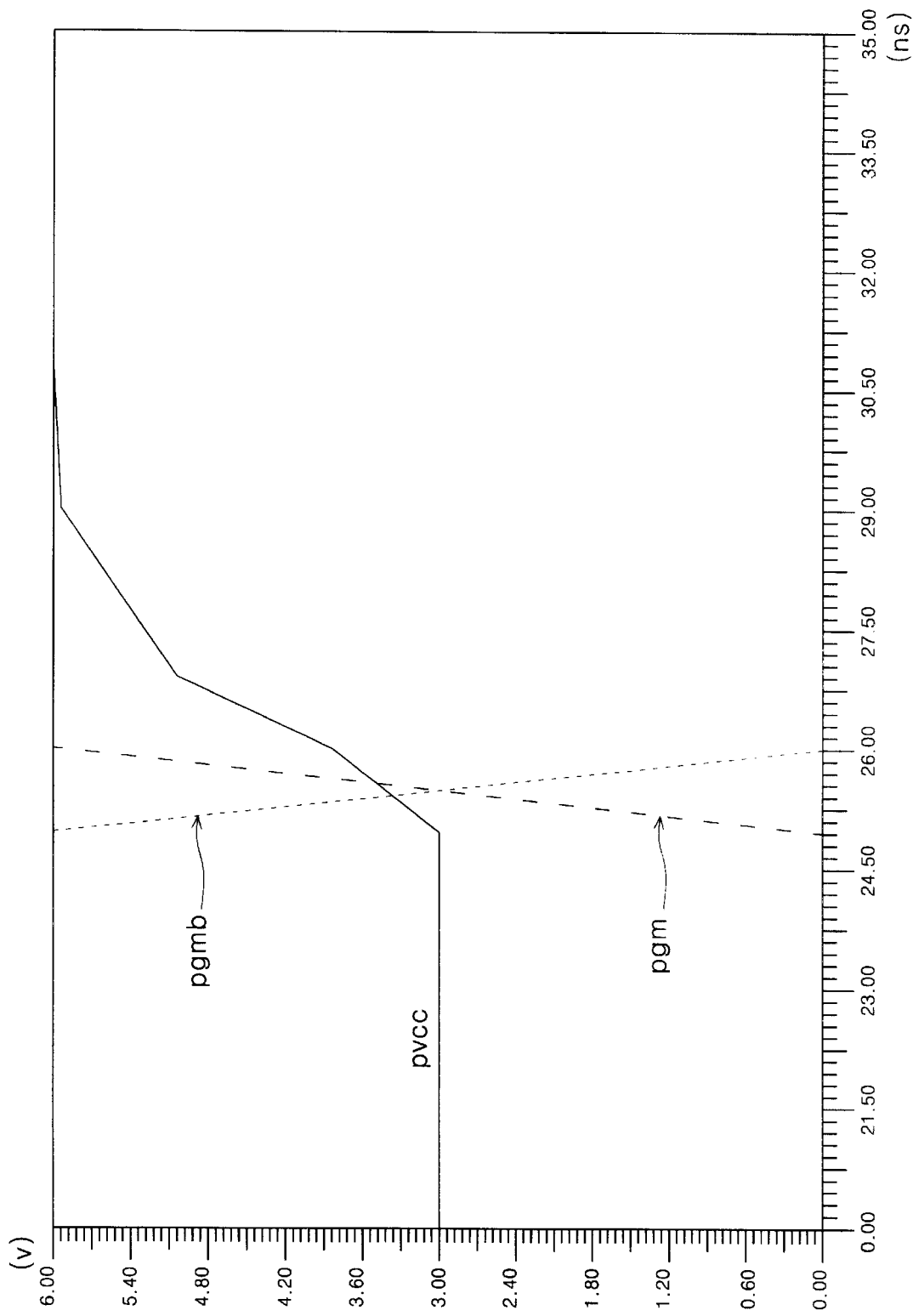
FIG. 3 is a graph showing the simulated results of input/output signals in a variable voltage generator in the anti-fuse programming circuit of FIG. 1.

FIG. 3 is a simulated graph showing variations in the output of the variable voltage generator 10. As shown in this drawing, the output voltage PVCC rises being delayed according to the time constant of the reserve capacitor in the buffer 20 although the programming signal pgm and complementary programming signal pgmb abruptly vary.

In this manner, the output voltage from the variable voltage generator 10 varies gently with the help of the buffer 20. This can prevent the anti-programming circuit from performing a faulty operation due to an abrupt voltage variation.

As apparent from the above description, according to the present invention, the anti-fuse can be programmed in a dielectric breakdown manner at a package step of a semiconductor device to interconnect two electrodes. This results in improvements in unit cost and reliability.

Further, because the variable voltage generator is used for the programming of the anti-fuse, the source voltage, or the high voltage, is not always supplied to the anti-fuse programming circuit. Moreover, after a dielectric breakdown occurs in the anti-fuse, the continuous power supply thereto is blocked. Therefore, current consumption can significantly be reduced in programming the anti-fuse.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An anti-fuse programming circuit comprising:
   variable voltage generation means for varying the level of its output voltage in response to a programming signal;
   buffering means for making gentle variations in said output voltage from said variable voltage generation means;
   operation switching means for precharging said anti-fuse programming circuit with said output voltage from said variable voltage generation means to operate it;
   an anti-fuse connected to said operation switching means, said anti-fuse being subjected to a dielectric breakdown when it is supplied with an overcurrent;
   sense signal input means for inputting a sense signal to verify a programmed state of said anti-fuse;
   breakdown voltage supply means for supplying said output voltage from said variable voltage generation means for the dielectric breakdown of said anti-fuse;
   output means for outputting a signal indicative of the programmed state of said anti-fuse in response to said sense signal inputted by said sense signal input means;
   current blocking means for blocking a current path from said breakdown voltage supply means to said anti-fuse in response to a control signal from said output means; and
   latch means for strongly stabilizing said anti-fuse at the level of said output voltage from said variable voltage generation means in response to said control signal from said output means.

2. An anti-fuse programming circuit as set forth in claim 1, wherein said variable voltage generation means includes switching means for switching said output voltage from said variable voltage generation means to any one of a source voltage and half voltage in response to said programming signal.

3. An anti-fuse programming circuit as set forth in claim 2, wherein said switching means includes:
   a first PMOS transistor connected between a source voltage terminal and an output terminal of said variable voltage generation means, said first PMOS transistor being switched in response to a complementary programming signal; and
   a second PMOS transistor connected between a half voltage terminal and said output terminal of said variable voltage generation means, said second PMOS transistor being switched in response to said programming signal.

4. An anti-fuse programming circuit as set forth in claim 1, wherein said buffering means includes a reserve capacitor connected between an output terminal of said variable voltage generation means and a ground voltage terminal.

5. An anti-fuse programming circuit as set forth in claim 1, wherein said operation switching means includes a PMOS transistor connected between an output terminal of said variable voltage generation means and said anti-fuse, said PMOS transistor being operated in response to a precharge signal.

6. An anti-fuse programming circuit as set forth in claim 1, wherein said sense signal input means includes an NMOS transistor connected between said anti-fuse and a ground voltage terminal, said NMOS transistor being operated in response to said sense signal.

7. An anti-fuse programming circuit as set forth in claim 1, wherein said breakdown voltage supply means includes a PMOS transistor connected between an output terminal of said variable voltage generation means and said current blocking means, said PMOS transistor being operated in response to said programming signal.

8. An anti-fuse programming circuit as set forth in claim 1, wherein said output means includes:

a first inverter connected to said anti-fuse, said first inverter being enabled by said output voltage from said variable voltage generation means to invert an output signal from said anti-fuse and output the inverted signal as said control signal; and a second inverter enabled by said output voltage from said variable voltage generation means to invert said control signal from said first inverter and output the inverted signal as said signal indicative of the programmed state of said anti-fuse.

9. An anti-fuse programming circuit as set forth in claim 1, wherein said current blocking means includes a PMOS transistor connected between an output terminal of said breakdown voltage supply means and said anti-fuse, said PMOS transistor being operated in response to said control signal from said output means.

10. An anti-fuse programming circuit as set forth in claim 1, wherein said latch means includes a PMOS transistor connected between said anti-fuse and an output terminal of said variable voltage generation means, said PMOS transistor being operated in response to said control signal from said output means.

* * * * *